US012750027B2

(12) United States Patent
Ting et al.

(10) Patent No.: US 12,750,027 B2
(45) Date of Patent: Sep. 29, 2026

(54) ELECTRONIC CIRCUIT INCLUDING A TUNABLE CIRCUIT WITH A TUNABLE SIGNAL PATH WHICH IS CONTROLLED BY FIRST AND SECOND DRIVER CIRCUITS

(71) Applicant: Innolux Corporation, Miaoli County (TW)

(72) Inventors: Chin-Lung Ting, Miaoli County (TW); Kazuyuki Hashimoto, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 148 days.

(21) Appl. No.: 18/429,433

(22) Filed: Feb. 1, 2024

(65) Prior Publication Data

US 2024/0372533 A1 Nov. 7, 2024

Related U.S. Application Data

(60) Provisional application No. 63/464,193, filed on May 5, 2023.

(51) Int. Cl.

*H03H 7/12* (2006.01)
*H03J 1/06* (2006.01)
*H03J 3/18* (2006.01)

(52) U.S. Cl.

CPC ................ *H03H 7/12* (2013.01); *H03J 1/06* (2013.01); *H03J 3/185* (2013.01)

(58) Field of Classification Search

CPC .................................. H03H 7/12; H03H 7/20
USPC ......................................................... 333/174
See application file for complete search history.

(56) References Cited

U.S. PATENT DOCUMENTS 5,752,179 A * 5/1998 Dobrovolny ......... H03H 7/1775 455/180.4
2004/0196121 A1* 10/2004 Toncich ............. G01R 27/2694 333/207

* cited by examiner

*Primary Examiner* — Benny T Lee
(74) *Attorney, Agent, or Firm* — JCIPRNET

(57) ABSTRACT

An electronic device is provided. The electronic device includes a tunable circuit and a driver circuit. The tunable circuit includes a first control terminal and a second control terminal. The driver circuit includes a first driver and a second driver. The first driver is coupled to the first control terminal of the tunable circuit. The second driver is coupled to the second control terminal of the tunable circuit.

20 Claims, 9 Drawing Sheets

ELECTRONIC CIRCUIT INCLUDING A TUNABLE CIRCUIT WITH A TUNABLE SIGNAL PATH WHICH IS CONTROLLED BY FIRST AND SECOND DRIVER CIRCUITS

CROSS-REFERENCE TO RELATED APPLICATION

This application claims the priority benefit of U.S. provisional application Ser. No. 63/464,193, filed on May 5, 2023. The entirety of the above-mentioned patent application is hereby incorporated by reference herein and made a part of this specification.

BACKGROUND

Technical Field

The disclosure relates to a device; particularly, the disclosure relates to an electronic device.

Description of Related Art

For a conventional tunable circuit, it may operate according to a control signal and a tunable signal. An operation frequency, of tunable signal flowing through the tunable circuit may be turned by the control signal. That is, wider voltage range of the control signal is expected to achieve wider tuning range of the operation frequency, but wider voltage range of the control signal induces reliability issue of driver circuit.

SUMMARY OF THE INVENTION

The electronic device of the disclosure includes a tunable circuit and a driver circuit. The tunable circuit includes a first control terminal and a second control terminal. The driver circuit includes a first driver and a second driver. The first driver is coupled to the first control terminal of the tunable circuit. The second driver is coupled to the second control terminal of the tunable circuit.

Based on the above, according to the electronic device of the disclosure, the driver circuit may effectively drive the tunable circuit through by the control signal with a wider voltage range, and the driver circuit may have good reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAIL DESCRIPTION OF THE EMBODIMENTS

Figure 1:
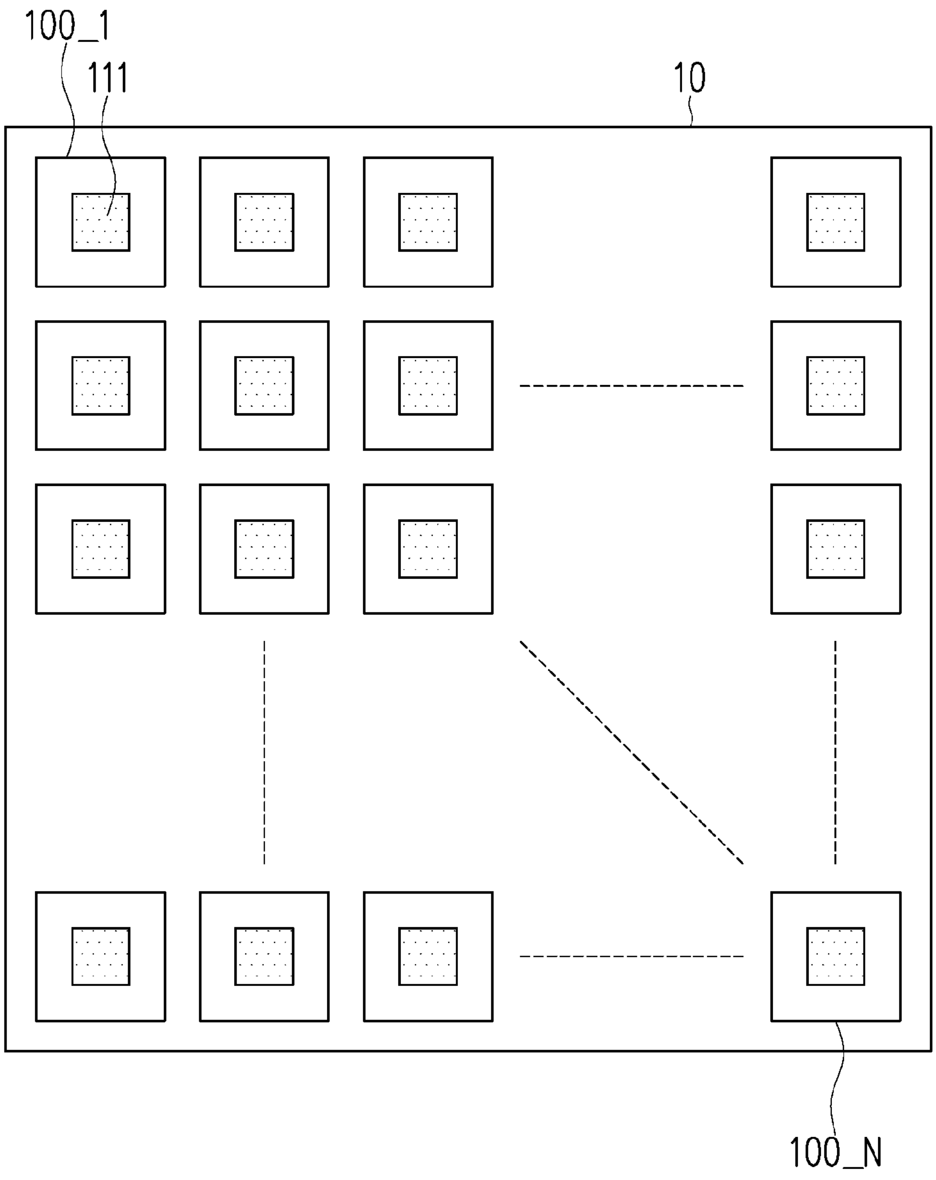
FIG. 1 is a schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the detail description to refer to the same or like components.

Certain terms are used throughout the specification and appended claims of the disclosure to refer to specific components. Those skilled in the art should understand that electronic device manufacturers may refer to the same components by different names. This specification does not intend to distinguish those components with the same function but different names. In the following description and rights request, the words such as "comprise" and "include" are open-ended terms, and should be explained as "including but not limited to. . .".

The term "coupling (or connection)" used throughout the whole specification of the present application (including the appended claims) may refer to any direct or indirect connection means. For example, if the text describes that a first device is coupled (or connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

FIG. 1 is a schematic diagram of an electronic device according to an embodiment of the disclosure. Referring to FIG. 1, the electronic device 10 includes a plurality of tunable units 100_1 to 100_N, and the tunable units 100_1 to 100_N may be arranged in an array as shown in FIG. 1, where N is a positive integer. Each of the tunable units 100_1 to 100_N includes a tunable component 111. In one embodiment of the disclosure, the each of the tunable units 100_1 to 100_N may be a resonator. A resonance frequency of each tunable unit may be tuned by a control signal of each corresponding tunable component.

In the embodiment of the disclosure, the tunable component 111 may be a voltage-controlled component (e.g. a variable capacitor, a varactor diode, or a Micro Electro Mechanical System (MEMS)), but the disclosure is not limited thereto. In one embodiment of the disclosure, the tunable component 111 may be a current-controlled component, a tunable capacitance component, a tunable inductance component or a tunable resistance component. In another embodiment of the disclosure, the electronic device 10 may be a beam-steerable directional antenna device, and the each of the tunable units 100_1 to 100_N may be an antenna unit.

Figure 2:
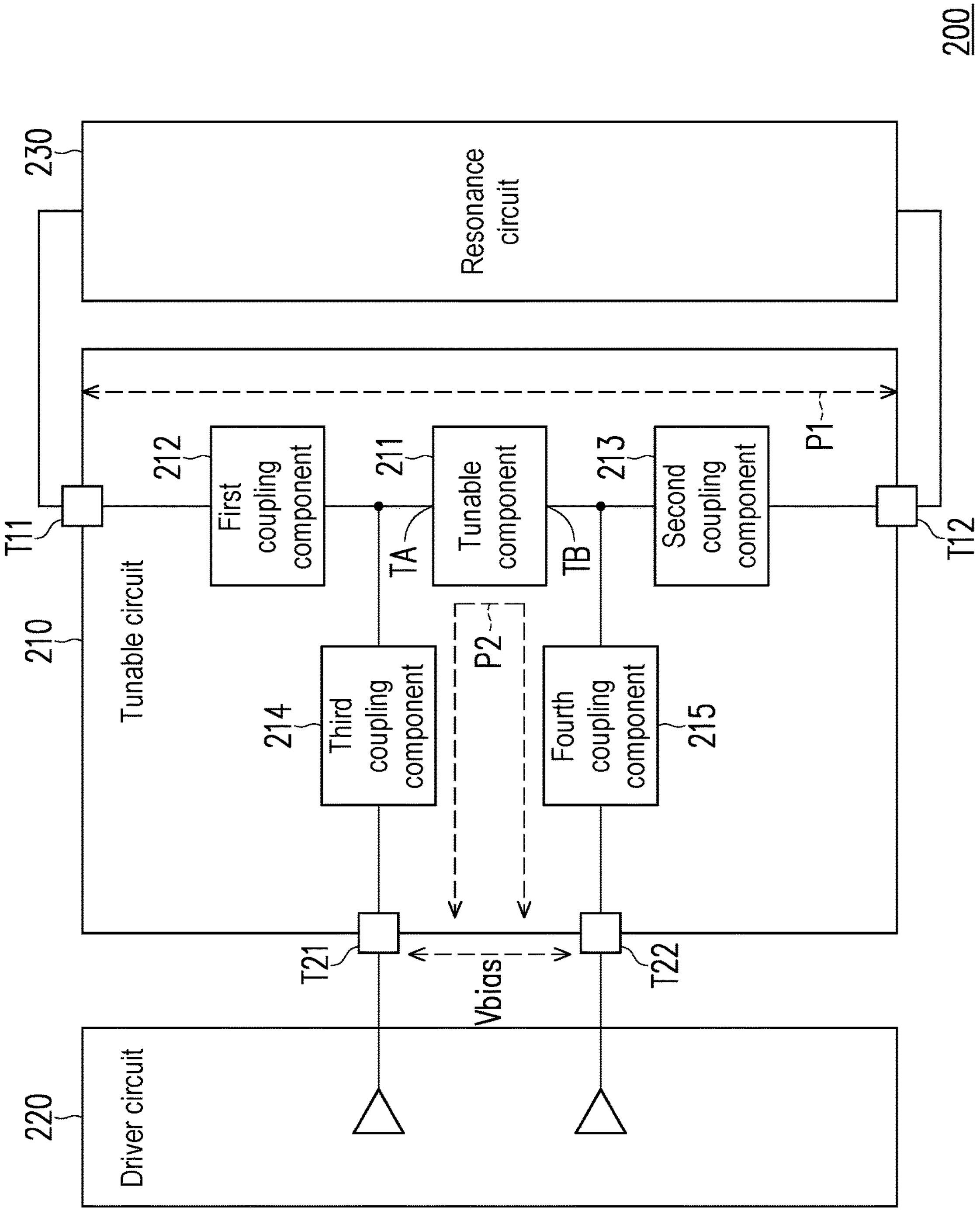
FIG. 2 is a schematic diagram of a tunable unit according to an embodiment of the disclosure.

FIG. 2 is a schematic diagram of a tunable unit according to an embodiment of the disclosure Referring to FIG. 2, the tunable unit 200 includes a tunable circuit 210, a driver circuit 220, and a resonance circuit 230. The tunable circuit 210 is coupled to the driver circuit 220. The tunable circuit 210 is further coupled to the resonance circuit 230 to form a tunable unit, such as a resonator. The resonance circuit 230 is coupled to the first signal terminal T11 and the second signal terminal T12. The each of the tunable units 100_1 to 100_N of FIG. 1 may be implemented as the tunable unit 200 formed by the tunable circuit 210, the driver circuit 220, and the resonance circuit 230 of FIG. 2. In the embodiment of the disclosure, the tunable circuit 210 includes a tunable component 211, a first coupling component 212, a second coupling component 213, a third coupling component 214, a fourth coupling component 215, a first signal terminal T11, a second signal terminal T12, a first control terminal T21, and a second control terminal T22.

In the embodiment of the disclosure, the tunable component 211 includes a first terminal TA and a second terminal TB. The first signal terminal T11 is coupled to the first terminal TA of the tunable component 211 through the first coupling component 212. The first coupling component 212 is coupled between the first terminal TA of the tunable component 211 and the first signal terminal T11. The second signal terminal T12 is coupled to the second terminal TB of the tunable component 211 through the second coupling component 213. The second coupling component 213 is coupled between the second terminal TB of the tunable component 211 and the second signal terminal T12. In the embodiment of the disclosure, the first signal terminal T11 and the second signal terminal T12 are coupled to the tunable component 211 through capacitive coupling respectively. In one embodiment of the disclosure, the first signal terminal T11 and the second signal terminal T12 may be coupled to the tunable component 211 through inductive coupling respectively. The first coupling component 212 and the second coupling component 213 may include at least one capacitor respectively (e.g. the Metal-Insulator-Metal (MIM) capacitor). In the embodiment of the disclosure, the first signal terminal T11, the first coupling component 212, the tunable component 211, the second coupling component 213 and the second signal terminal T12 form a tunable signal path P1. In the embodiment of the disclosure, a coupling coefficient corresponding to the first coupling component 212 and the second coupling component 213 may be optimized to cover a frequency band of signal to be tuned (i.e. form a high-pass filter).

In the embodiment of the disclosure, the first control terminal T21 is coupled to the first terminal TA of the tunable component 211 through the third coupling component 214. The third coupling component 214 is coupled between the first terminal TA of the tunable component 211 and the first control terminal T21. The second control terminal T22 is coupled to the second terminal TB of the tunable component 211 through the fourth coupling component 215. The fourth coupling component 215 is coupled between the second terminal TB of the tunable component 211 and the second control terminal T22. In one embodiment of the disclosure, the first control terminal T21 and the second control terminal T22 are coupled to the tunable component 211 through resistive coupling and/or inductive coupling respectively. The third coupling component 214 and the fourth coupling component 215 may include at least one of a resistor and an inductor respectively. In the embodiment of the disclosure, the first control terminal T21, the third coupling component 214, the tunable component 211, the fourth coupling component 215 and the second control terminal T22 form a control signal path P2. In the embodiment of the disclosure, a coupling coefficient corresponding to the third coupling component 214 and the fourth coupling component 215 may be optimized to block the frequency band of signal to be tuned (i.e. form a low-pass filter or a RF choke).

In the embodiment of the disclosure, the tunable circuit 210, the driving circuit 220, and the resonance circuit 230 form the tunable unit 200, therefore a tunable signal flows through the first signal terminal T11, the first coupling component 212, the tunable component 211, the second coupling component 213, the second signal terminal T12, and the resonance circuit 230. The tunable signal may be an alternating current (AC) signal with a signal frequency. In the embodiment of the disclosure, the first control terminal T21 and the second control terminal T22 may receive a differential signal. That is, there is a differential in voltage with respect to the first control terminal T21 and the second control terminal T22 (i.e. a voltage difference between the first control terminal T21 and the second control terminal T22).

In the embodiment of the disclosure, due to the first signal terminal T11 and the second signal terminal T12 are coupled to the tunable component 211 through the capacitive coupling, the DC signal or the AC signal with low signal frequency may not reach to the first signal terminal T11 and the second signal terminal T12 (i.e. the tunable signal path P1) by the first coupling component 212 and the second coupling component 213. Moreover, the differential bias voltage Vbias from the first control terminal T21 and the second control terminal T22 may reach to the tunable component 211 through the resistive coupling and/or the inductive coupling (i.e. the control signal path P2), but the tunable signal from the tunable signal path P1 may be blocked due to the resistive coupling and/or the inductive coupling formed with the third coupling component 214 and the fourth coupling component 215.

In the embodiment of the disclosure, the tunable signal path P1 between the first signal terminal T11 and the second signal terminal T12 may be tuned by the differential bias voltage Vbias with the first control terminal T21 and the second control terminal T22. A capacitive coupling between the first signal terminal T11 and the second signal terminal T12 may be tuned by the differential bias voltage Vbias with the first control terminal T21 and the second control terminal T22 (i.e. the voltage difference between the first control terminal T21 and the second control terminal T22). Specifically, the resonance frequency of the resonance circuit 230 may be tuned by the capacitive coupling between the first signal terminal T11 and the second signal terminal T12, and the capacitive coupling between the first signal terminal T11 and the second signal terminal T12 may be tuned by the tunable component 211 according to a voltage level of the differential bias voltage Vbias with the first control terminal T21 and the second control terminal T22 (i.e. the voltage difference between the first control terminal T21 and the second control terminal T22). Moreover, a good signal isolation in a frequency domain between the tunable signal path P1 and the control signal path P2 may be realized by the first coupling component 212, the second coupling component 213, the third coupling component 214 and the fourth coupling component 215.

The specific circuit architecture of the driver circuit of the disclosure will be described in detail in the following embodiments of FIG. 3 to FIG. 9.

Figure 3:
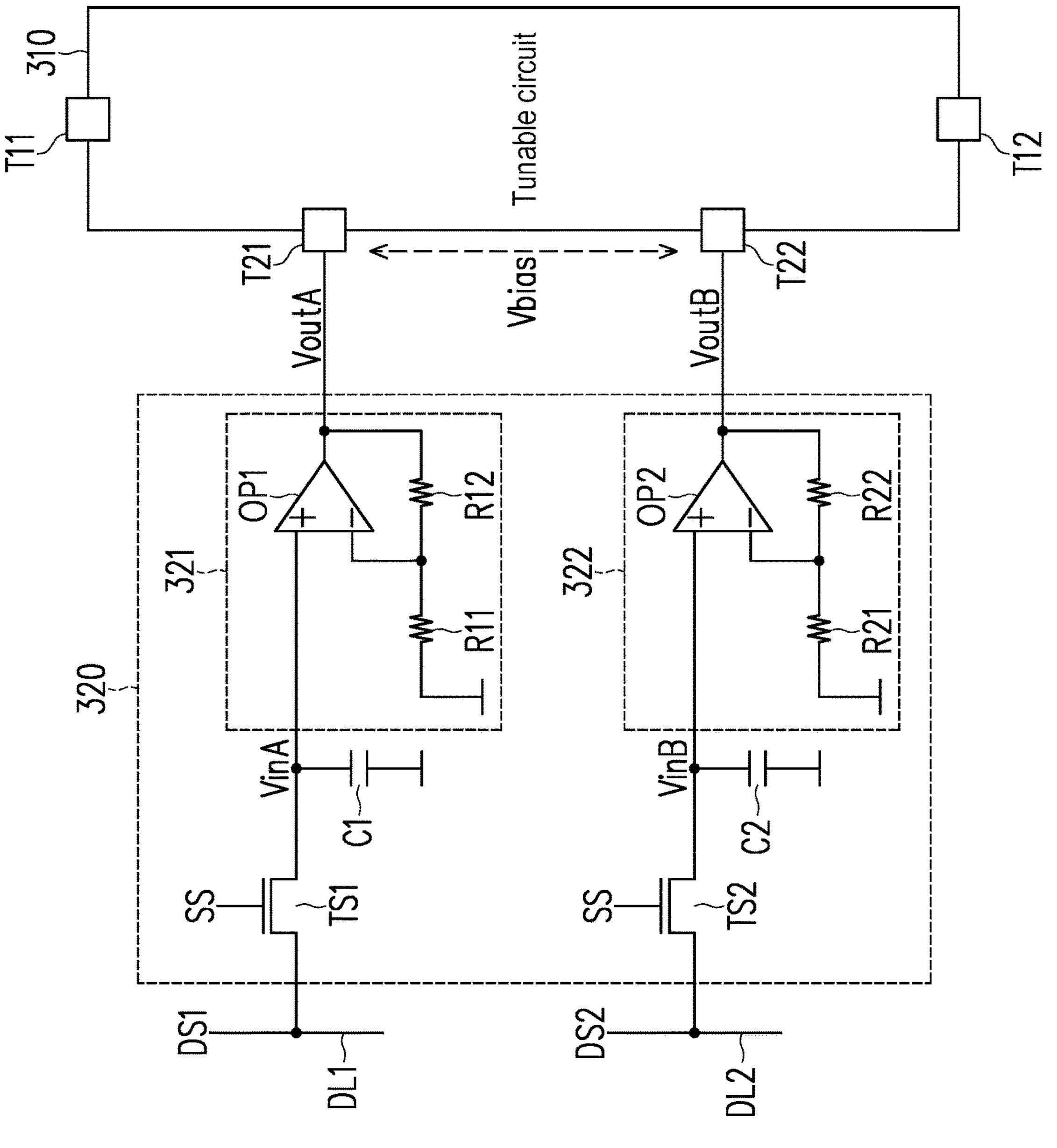
FIG. 3 is a schematic diagram of a driver circuit according to an embodiment of the disclosure.

FIG. 3 is a schematic diagram of a driver circuit according to an embodiment of the disclosure. Referring to FIG. 3, a tunable circuit 310 includes a first signal terminal T11, a second signal terminal T12, a first control terminal T21, and a second control terminal T22. The tunable circuit 310 may be implemented as the tunable circuit 210 of FIG. 2. A driver circuit 320 includes a first driver 321, a second driver 322, a first scan transistor TS1, a second transistor TS2, a first capacitor C1, and a second capacitor C2. The driver circuit 220 of FIG. 2 may be implemented as the driver circuit 320. In the embodiment of the disclosure, a first terminal of the first scan transistor TS1 is coupled to a first data line DL1, and a second terminal of the first scan transistor TS1 is coupled to the first capacitor C1 and the first driver 321. A control terminal of the first scan transistor TS1 is configured to receive a scan signal SS. The first data line DL1 is configured to transmit a first data signal DS1. The first capacitor C1 is coupled between the second terminal of the first scan transistor TS1 and a DC voltage (e.g. a ground voltage), and the first capacitor C1 is further coupled to the first driver 321. A first terminal of second scan transistor TS2 is coupled to a second data line DL2, and a second terminal of the second scan transistor TS2 is coupled to the second capacitor C2 and the second driver 322. A control terminal of the second scan transistor TS2 is configured to receive the scan signal SS. The second data line DL2 is configured to transmit a second data signal DS2. The second capacitor C2 is coupled between the second terminal of the second scan transistor TS2 and the DC voltage, and the second capacitor C2 is further coupled to the second driver 322.

In the embodiment of the disclosure, the first driver 321 may be a first non-inverting amplifier circuit. The first driver 321 includes a first operational amplifier OP1, a first resistor R11 and a second resistor R12, but the disclosure in not limited thereto. In one embodiment of the disclosure, the first driver 321 may include a first source follower amplifier instead of the first operational amplifier OP1. In the embodiment of the disclosure, a non-inverting input terminal of the first operational amplifier OP1 is coupled to the second terminal of the first scan transistor TS1 and the first capacitor C1. An inverting input terminal of the first operational amplifier OP1 is coupled to the first resistor R11 and the second resistor R12. The first resistor R11 is coupled between the DC voltage and the inverting input terminal of the first operational amplifier OP1. The second resistor R12 is coupled between the inverting input terminal of the first operational amplifier OP1 and an output terminal of the first operational amplifier OP1. The output terminal of the first operational amplifier OP1 is coupled to the first control terminal T21 of the tunable circuit 310.

In the embodiment of the disclosure, the second driver 322 may be a second non-inverting amplifier circuit. The second driver 322 includes a second operational amplifier OP2, a third resistor R21 and a fourth resistor R22, but the disclosure in not limited thereto. In one embodiment of the disclosure, the second driver 322 may include a second source follower amplifier instead of the second operational amplifier OP2. In the embodiment of the disclosure, a non-inverting input terminal of the second operational amplifier OP2 is coupled to the second terminal of the second scan transistor TS2 and the second capacitor C2. An inverting input terminal of the second operational amplifier OP2 is coupled to the third resistor R21 and the fourth resistor R22. The third resistor R21 is coupled between the DC voltage and the inverting input terminal of the second operational amplifier OP2. The fourth resistor R22 is coupled between the inverting input terminal of the second operational amplifier OP2 and an output terminal of the second operational amplifier OP2. The output terminal of the second operational amplifier OP2 is coupled to the second control terminal T22 of the tunable circuit 310.

Figure 4:
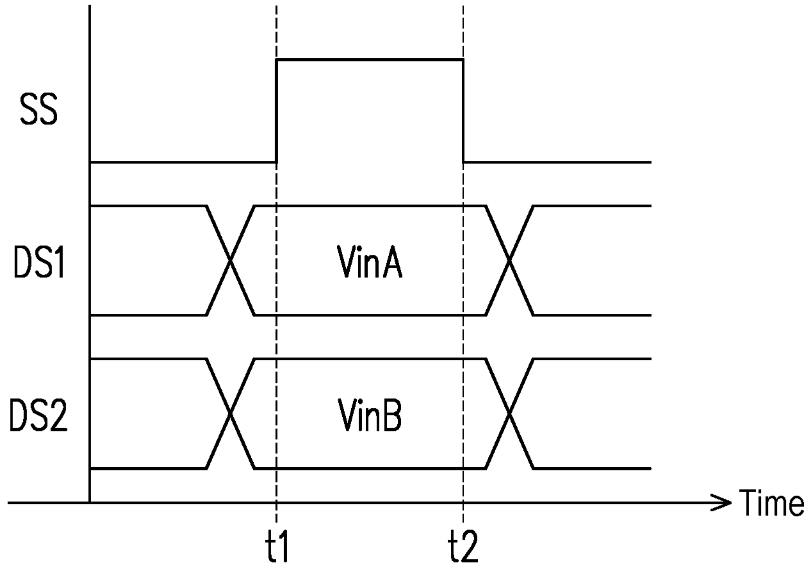
FIG. 4 is a timing diagram of relevant signals according to the embodiment of the FIG. 3.

FIG. 4 is a timing diagram of relevant signals according to the embodiment of the FIG. 3. Referring to FIG. 3 and FIG. 4, in the embodiment of the disclosure, the first scan transistor TS1 receives the first data signal DS1 through the first data line DL1. During a period from time t1 to time t2, the scan signal SS is changed to a high voltage level, and the first scan transistor TS1 is turned-on, so that the first scan transistor TS1 outputs a first data voltage VinA to the first capacitor C1 according to the first data signal DS1. The first capacitor C1 may hold the first data voltage VinA at the non-inverting input terminal of the first operational amplifier OP1.

In the embodiment of the disclosure, the second scan transistor TS2 receives the second data signal DS2 through the second data line DL2. During the same period from time t1 to time t2, the second scan transistor TS2 is turned-on, so that the second scan transistor TS2 outputs a second data voltage VinB to the second capacitor C2 according to the second data signal DS2. The second capacitor C2 may hold the second data voltage VinB at the non-inverting input terminal of the second operational amplifier OP2.

In the embodiment of the disclosure as shown in FIG. 3, a first voltage gain of the first driver 321 may be G1, and the first voltage gain G1 may be determined by the resistances of the first resistor R11 and the second resistor R12. A second voltage gain of the second driver 322 may be G2, and the second voltage gain G2 may be determined by the resistances of the third resistor R21 and the fourth resistor R22. The first operational amplifier OP1 may output a first variable voltage VoutA to the first control terminal T21 of the tunable circuit 310 according to the first data voltage VinA and the first voltage gain G1. The first variable voltage VoutA may be equal to the result of multiplying the first data voltage VinA and the first voltage gain G1 (i.e. VoutA=VinA×G1). The second operational amplifier OP2 may output a second variable voltage VoutB to the second control terminal T22 of the tunable circuit 310 according to the second data voltage VinB and the second voltage gain G2. The second variable voltage VoutB may be equal to the result of multiplying the second data voltage VinB and the second voltage gain G2 (i.e. VoutB=VinB×G2). There is a differential bias voltage Vbias with the first control terminal T21 and the second control terminal T22 (i.e. a voltage difference between the first control terminal T21 and the second control terminal T22), and the differential bias voltage Vbias is equal to the first variable voltage VoutA minus the second variable voltage VoutB (i.e. Vbias=VoutA−VoutB=(VinA×G1)−(VinB×G2)).

For example, if a voltage range of the first data voltage VinA is 0 to 5V, the voltage range of the second data voltage VinB is −5 to 0V (volt), and the voltage gains G1 and G2 are equal to 1, a voltage range of the differential bias voltage Vbias may be 0 to 10V. That is, an operation range of each of the first driver 321 and the second driver 322 is 5V, but an operation range of the differential bias voltage Vbias can reach 10V. Moreover, the differential bias voltage Vbias with the first control terminal T21 and the second control terminal T22 is realized with voltage difference between the first control terminal T21 and the second control terminal T22.

Therefore, the driver circuit 320 may effectively drive the tunable circuit 310 by applying the differential bias voltage Vbias with the first control terminal T21 and the second control terminal T22 of the tunable circuit 310. Moreover, since the first driver 321 and the second driver 322 only need to operate in narrower voltage ranges to achieve the differential bias voltage Vbias with a wider voltage range without exceeding a voltage tolerance, therefore the driver circuit 320 may have good reliability.

In addition, in one embodiment of the disclosure, the first voltage gain G1 may be different from the second voltage gain G2. In one embodiment of the disclosure, the voltage range of the first data voltage VinA may also be different from the voltage range of the second data voltage VinB, so that the first variable voltage VoutA and the second variable voltage VoutB have different output voltage range.

Figure 5:
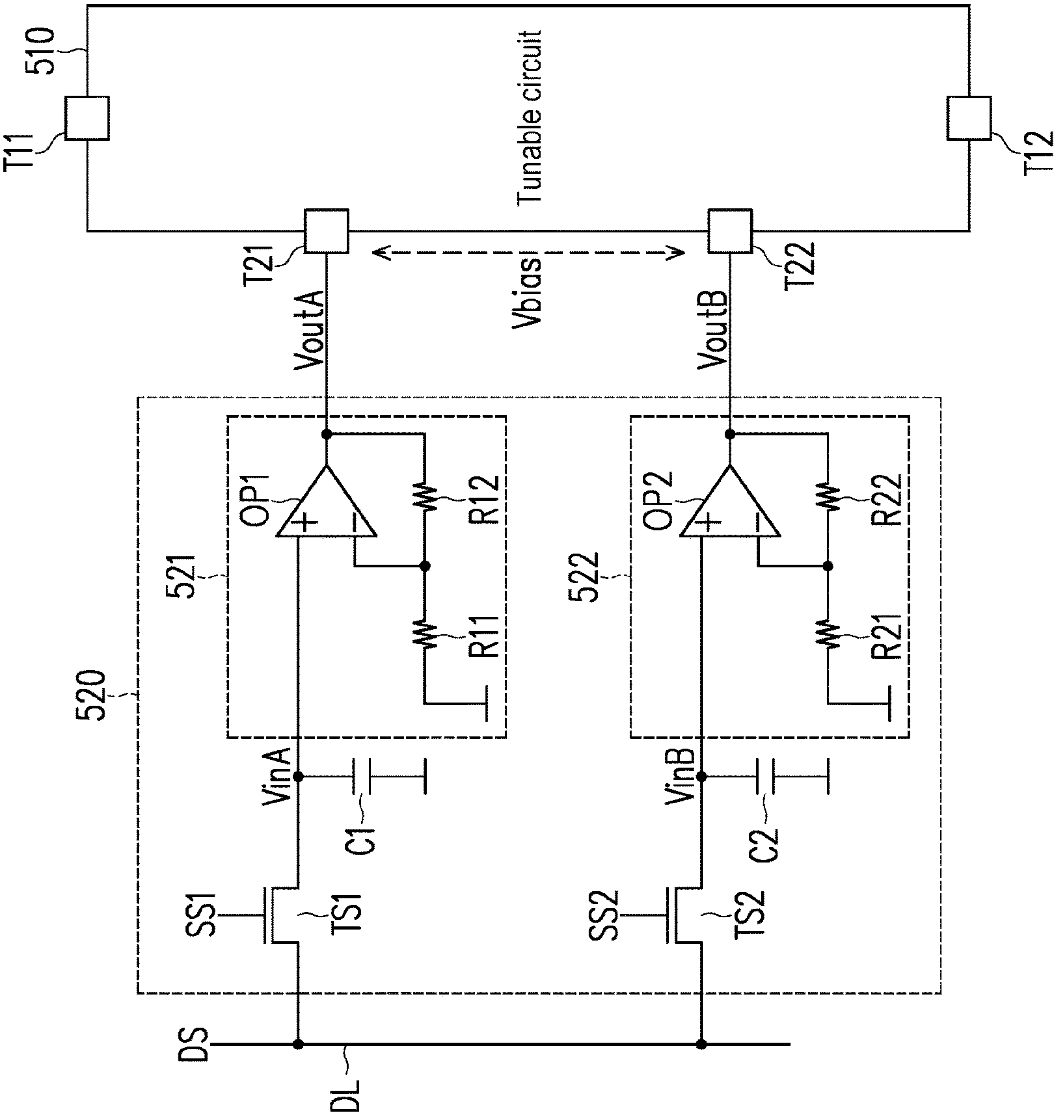
FIG. 5 is a schematic diagram of a driver circuit according to an embodiment of the disclosure.

FIG. 5 is a schematic diagram of a driver circuit according to an embodiment of the disclosure. Referring to FIG. 5, a tunable circuit 510 includes a first signal terminal T11, a second signal terminal T12, a first control terminal T21, and a second control terminal T22. The tunable circuit 510 may be implemented as the tunable circuit 210 of FIG. 2. A driver circuit 520 includes a first driver 521, a second driver 522, a first scan transistor TS1, a second transistor TS2, a first capacitor C1, and a second capacitor C2. The driver circuit 220 of FIG. 2 may be implemented as the driver circuit 520. In the embodiment of the disclosure, a first terminal of first scan transistor TS1 is coupled to a data line DL, and a second terminal of the first scan transistor TS1 is coupled to the first capacitor C1 and the first driver 521. A control terminal of the first scan transistor TS1 is configured to receive a first scan signal SS1. The data line DL is configured to transmit a data signal DS. The first capacitor C1 is coupled between the second terminal of the first scan transistor TS1 and a DC voltage (e.g. a ground voltage), and the first capacitor C1 is coupled to the first driver 521. A first terminal of second scan transistor TS2 is coupled to the data line DL, and a second terminal of the second scan transistor TS2 is coupled to the second capacitor C2 and the second driver 522. A control terminal of the second scan transistor TS2 is configured to receive a second scan signal SS2. The second capacitor C2 is coupled between the second terminal of the second scan transistor TS2 and the DC voltage, and the second capacitor C2 is coupled to the second driver 522.

In the embodiment of the disclosure, the first driver 521 may be a first non-inverting amplifier circuit. The first driver 521 includes a first operational amplifier OP1, a first resistor R11 and a second resistor R12, but the disclosure in not limited thereto. In one embodiment of the disclosure, the first driver 521 may include a first source follower amplifier instead of the first operational amplifier OP1. In the embodiment of the disclosure, a non-inverting input terminal of the first operational amplifier OP1 is coupled to the second terminal of the first scan transistor TS1 and the first capacitor C1. An inverting input terminal of the first operational amplifier OP1 is coupled to the first resistor R11 and the second resistor R12. The first resistor R11 is coupled between the DC voltage and the inverting input terminal of the first operational amplifier OP1. The second resistor R12 is coupled between the inverting input terminal of the first operational amplifier OP1 and an output terminal of the first operational amplifier OP1. The output terminal of the first operational amplifier OP1 is coupled to the first control terminal T21 of the tunable circuit 510.

In the embodiment of the disclosure, the second driver 522 may be a second non-inverting amplifier circuit. The second driver 522 includes a second operational amplifier OP2, a third resistor R21 and a fourth resistor R22, but the disclosure in not limited thereto. In one embodiment of the disclosure, the second driver 522 may include a second source follower amplifier instead of the second operational amplifier OP2. In the embodiment of the disclosure, a non-inverting input terminal of the second operational amplifier OP2 is coupled to the second terminal of the second scan transistor TS2 and the second capacitor C2. An inverting input terminal of the second operational amplifier OP2 is coupled to the third resistor R21 and the fourth resistor R22. The third resistor R21 is coupled between the DC voltage and the inverting input terminal of the second operational amplifier OP2. The fourth resistor R22 is coupled between the inverting input terminal of the second operational amplifier OP2 and an output terminal of the second operational amplifier OP2. The output terminal of the second operational amplifier OP2 is coupled to the second control terminal T22 of the tunable circuit 510.

Figure 6:
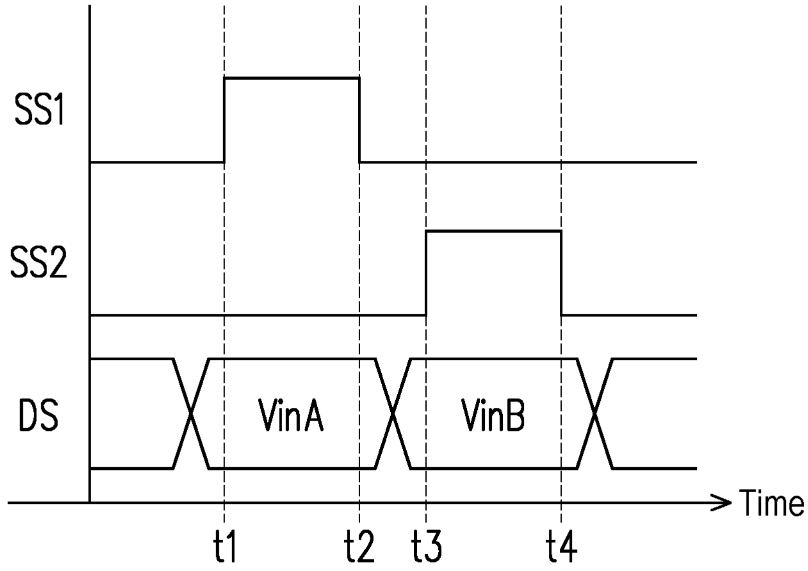
FIG. 6 is a timing diagram of relevant signals according to the embodiment of the FIG. 5.

FIG. 6 is a timing diagram of relevant signals according to the embodiment of the FIG. 5. Referring to FIG. 5 and FIG. 6, in the embodiment of the disclosure, the first scan transistor TS1 (FIG. 5) receives the data signal DS through the data line DL (FIG. 5). During a first period from time t1 to time t2 as shown in FIG. 6, the first scan signal SS1 is changed to a high voltage level, and the first scan transistor TS1 is turned-on, so that the first scan transistor TS1 outputs a first data voltage VinA to the first capacitor C1 (FIG. 5) according to the data signal DS. The first capacitor C1 may hold the first data voltage VinA at the non-inverting input terminal of the first operational amplifier OP1 (FIG. 5).

In the embodiment of the disclosure, the second scan transistor TS2 (FIG. 5) receives the same data signal DS through the data line DL as shown in FIG. 5. During a second period from time t3 to time t4 as shown in FIG. 5, the second scan signal SS2 is changed to a high voltage level, and the second scan transistor TS2 is turned-on, so that the second scan transistor TS2 outputs a second data voltage VinB to the second capacitor C2 (FIG. 5) according to the data signal DS. The second capacitor C2 may hold the second data voltage VinB at the non-inverting input terminal of the second operational amplifier OP2 (FIG. 5).

In one embodiment of the disclosure, the first scan transistor TS1 and the second scan transistor TS2 may be turned-on sequentially, so that the first operational amplifier OP1 and the second operational amplifier OP2 may receive independent data voltages.

In the embodiment of the disclosure as shown in FIG. 5, a first voltage gain of the first driver 521 may be G1, and the first voltage gain G1 may be determined by the resistances of the first resistor R11 and the second resistor R12. A second voltage gain of the second driver 522 may be G2, and the second voltage gain G2 may be determined by the resistances of the third resistor R21 and the fourth resistor R22. The first operational amplifier OP1 may output a first variable voltage VoutA to the first control terminal T21 of the tunable circuit 510 according to the first data voltage VinA and the first voltage gain G1. The first variable voltage VoutA may be equal to the result of multiplying the first data voltage VinA and the first voltage gain G1 (i.e. $VoutA=VinA\times G1$). The second operational amplifier OP2 may output a second variable voltage VoutB to the second control terminal T22 of the tunable circuit 510 according to the second data voltage VinB and the second voltage gain G2. The second variable voltage VoutB may be equal to the result of multiplying the second data voltage VinB and the second voltage gain G2 (i.e. VoutB=VinB×G2). There is a differential bias voltage Vbias with the first control terminal T21 and the second control terminal T22 (i.e. a voltage difference between the first control terminal T21 and the second control terminal T22), and the differential bias voltage Vbias is equal to the first variable voltage VoutA minus the second variable voltage VoutB (i.e. Vbias=VoutA−VoutB=(VinA×G1)−(VinB×G2)).

In the embodiment of the disclosure, the first driver 521 and the second driver 522 may receive the independent data voltages in sequence. For example, if a voltage range of the first data voltage VinA is 0 to 5V, a voltage range of the second data voltage VinB is −5 to 0V, and the voltage gains G1 and G2 are equal to 1, a bias voltage range of the differential bias voltage Vbias may be 0 to 10V. That is, the operation range of each of the first driver 521 and the second driver 522 is 5V, but the differential bias voltage Vbias can reach 10V. Moreover, a tunable signal path between the first signal terminal T11 of the tunable circuit 510 and the second signal terminal T12 of the tunable circuit 510 may be tunable with the differential bias voltage Vbias with the first control terminal T21 of the tunable circuit 510 and the second control terminal T22 of the tunable circuit 510 (i.e. the voltage difference between the first control terminal T21 of the tunable circuit 510 and the second control terminal T22 of the tunable circuit 510).

Therefore, the driver circuit 520 may effectively drive the tunable circuit 510 by applying the differential bias voltage Vbias with the first control terminal T21 and the second control terminal T22. Moreover, since the first driver 521 and the second driver 522 only need to operate in narrower voltage ranges to achieve the differential bias voltage Vbias with a wider voltage range without exceeding the voltage tolerance, therefore the driver circuit 520 may have good reliability.

In addition, in one embodiment of the disclosure, the first voltage gain G1 may be different from the second voltage gain G2. In one embodiment of the disclosure, the voltage range of the first data voltage VinA may also be different from the voltage range of the second data voltage VinB, so that the first variable voltage VoutA and the second variable voltage VoutB have different output voltage range.

Figure 7:
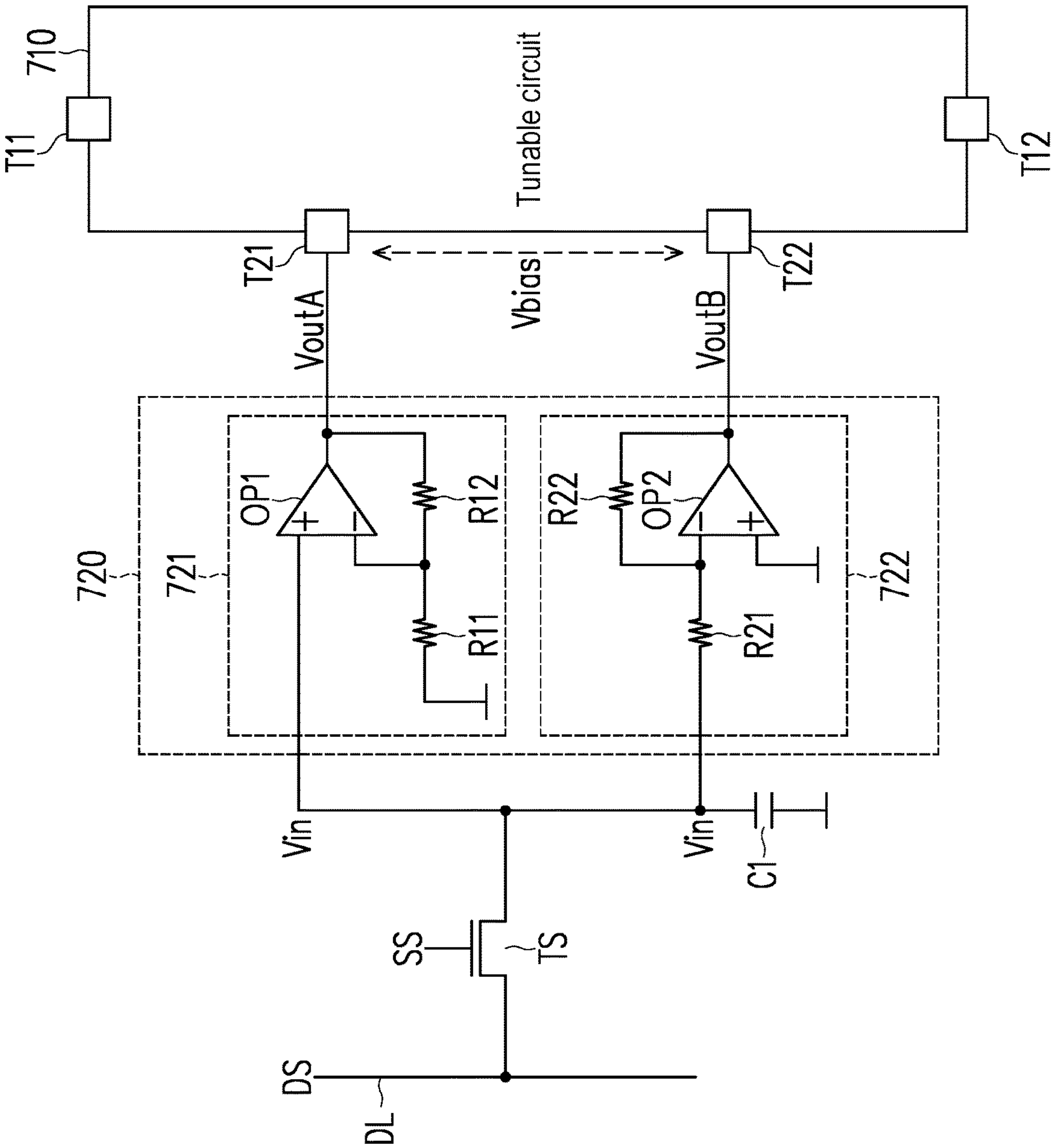
FIG. 7 is a schematic diagram of a driver circuit according to an embodiment of the disclosure.

FIG. 7 is a schematic diagram of a driver circuit according to an embodiment of the disclosure Referring to FIG. 7, a tunable circuit 710 includes a first signal terminal T11, a second signal terminal T12, a first control terminal T21, and a second control terminal T22. The tunable circuit 710 may be implemented as the tunable circuit 210 of FIG. 2. A driver circuit 720 includes a first driver 721, a second driver 722, a scan transistor TS, and a capacitor C1. The driver circuit 220 of FIG. 2 may be implemented as the driver circuit 720. In the embodiment of the disclosure, a first terminal of scan transistor TS is coupled to a data line DL, and a second terminal of the scan transistor TS is coupled to the capacitor C1, the first driver 721, and the second driver 722. A control terminal of the scan transistor TS is configured to receive a scan signal SS. The data line DL is configured to transmit a data signal DS. The capacitor C1 is coupled between the second terminal of the scan transistor TS and a DC voltage (e.g. a ground voltage), and the capacitor C1 is further coupled to the first driver 721 and the second driver 722.

In the embodiment of the disclosure, the first driver 721 may be a non-inverting amplifier circuit. The first driver 721 includes a first operational amplifier OP1, a first resistor R11 and a second resistor R12, but the disclosure in not limited thereto. In one embodiment of the disclosure, the first driver 721 may include a first source follower amplifier instead of the first operational amplifier OP1. In the embodiment of the disclosure, a non-inverting input terminal of the first operational amplifier OP1 is coupled to the second terminal of the scan transistor TS and the capacitor C1. An inverting input terminal of the first operational amplifier OP1 is coupled to the first resistor R11 and the second resistor R12. The first resistor R11 is coupled between the DC voltage and the inverting input terminal of the first operational amplifier OP1. The second resistor R12 is coupled between the inverting input terminal of the first operational amplifier OP1 and an output terminal of the first operational amplifier OP1. The output terminal of the first operational amplifier OP1 is coupled to the first control terminal T21 of the tunable circuit 710.

In the embodiment of the disclosure, the second driver 722 may be an inverting amplifier circuit. The second driver 722 includes a second operational amplifier OP2, a third resistor R21 and a fourth resistor R22, but the disclosure in not limited thereto. In one embodiment of the disclosure, the second driver 722 may include a second source follower amplifier instead of the second operational amplifier OP2. In the embodiment of the disclosure, an inverting input terminal of the second operational amplifier OP2 is coupled to the second terminal of the scan transistor TS and the capacitor C1 through the third resistor R21, and the inverting input terminal of the second operational amplifier OP2 is further coupled to an output terminal of the second operational amplifier OP2 through the fourth resistor R22. A non-inverting input terminal of the second operational amplifier OP2 is coupled to the DC voltage. The output terminal of the second operational amplifier OP2 is further coupled to the second control terminal T22 of the tunable circuit 710.

Figure 8:
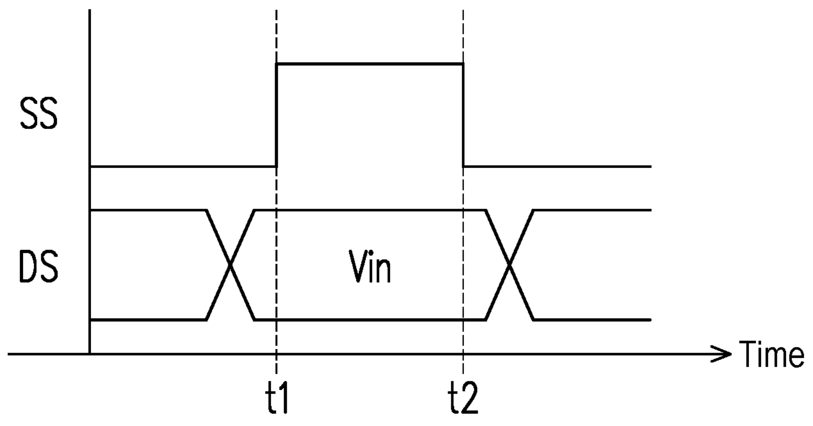
FIG. 8 is a timing diagram of relevant signals according to the embodiment of the FIG. 7.

FIG. 8 is a timing diagram of relevant signals according to the embodiment of the FIG. 7. Referring to FIG. 7 and FIG. 8, in the embodiment of the disclosure, the scan transistor TS (FIG. 7) receives the data signal DS through the data line DL (FIG. 7). During a period from time t1 to time t2 as shown in FIG. 8, the scan signal SS is changed to a high voltage level, and the scan transistor TS is turned-on, so that the scan transistor TS outputs a data voltage Vin to the capacitor C1 (FIG. 7) according to the data signal DS. The capacitor C1 may hold the data voltage Vin at the non-inverting input terminal of the first operational amplifier OP1 and a terminal of the third resistor R21 coupled to the capacitor C1 as shown in FIG. 7.

In the embodiment of the disclosure as shown in FIG. 7, a first voltage gain of the first driver 721 may be G1, and the first voltage gain G1 may be determined by the resistances of the first resistor R11 and the second resistor R12. A second voltage gain of the second driver 722 may be G2, and the second voltage gain G2 may be determined by the resistances of the third resistor R21 and the fourth resistor R22. The first operational amplifier OP1 may output a first variable voltage VoutA to the first control terminal T21 of the tunable circuit 710 according to the data voltage Vin and the first voltage gain G1. The first variable voltage VoutA may be equal to the result of multiplying the data voltage Vin and the first voltage gain G1 (i.e. VoutA=Vin×G1). The second operational amplifier OP2 may output a second variable voltage VoutB to the second control terminal T22 of the tunable circuit 710 according to the data voltage Vin and the second voltage gain G2. The second variable voltage VoutB may be equal to the result of multiplying the data voltage Vin and the second voltage gain G2 (i.e.

VoutB=Vin×G2). There is a differential bias voltage Vbias with the first control terminal T21 and the second control terminal T22, and the differential bias voltage Vbias is equal to the first variable voltage VoutA minus the second variable voltage VoutB (i.e. Vbias=VoutA−VoutB=(Vin×G1)−(Vin×G2)).

In the embodiment of the disclosure, the first driver 721 and the second driver 722 may receive the same data voltage Vin at the same time. For example, if a voltage range of the data voltage Vin is 0 to 5V, the voltage gain G1 is equal to 1, and the voltage gain G2 is equal to −1, a bias voltage range of the differential bias voltage Vbias may be 0 to 10V. That is, the operation range of each of the first driver 721 and the second driver 722 is 5V, but the differential bias voltage Vbias can reach 10V. Moreover, the differential bias voltage Vbias with the first control terminal T21 and the second control terminal T22 is realized with voltage difference between the first control terminal T21 and the second control terminal T22.

Therefore, the driver circuit 720 may effectively drive the tunable circuit 710 by applying the differential bias voltage Vbias with the first control terminal T21 and the second control terminal T22. Moreover, since the first driver 721 and the second driver 722 only need to operate in narrower voltage ranges to achieve the differential bias voltage Vbias with a wider voltage range without exceeding the voltage tolerance, therefore the driver circuit 720 may have good reliability.

Figure 9:
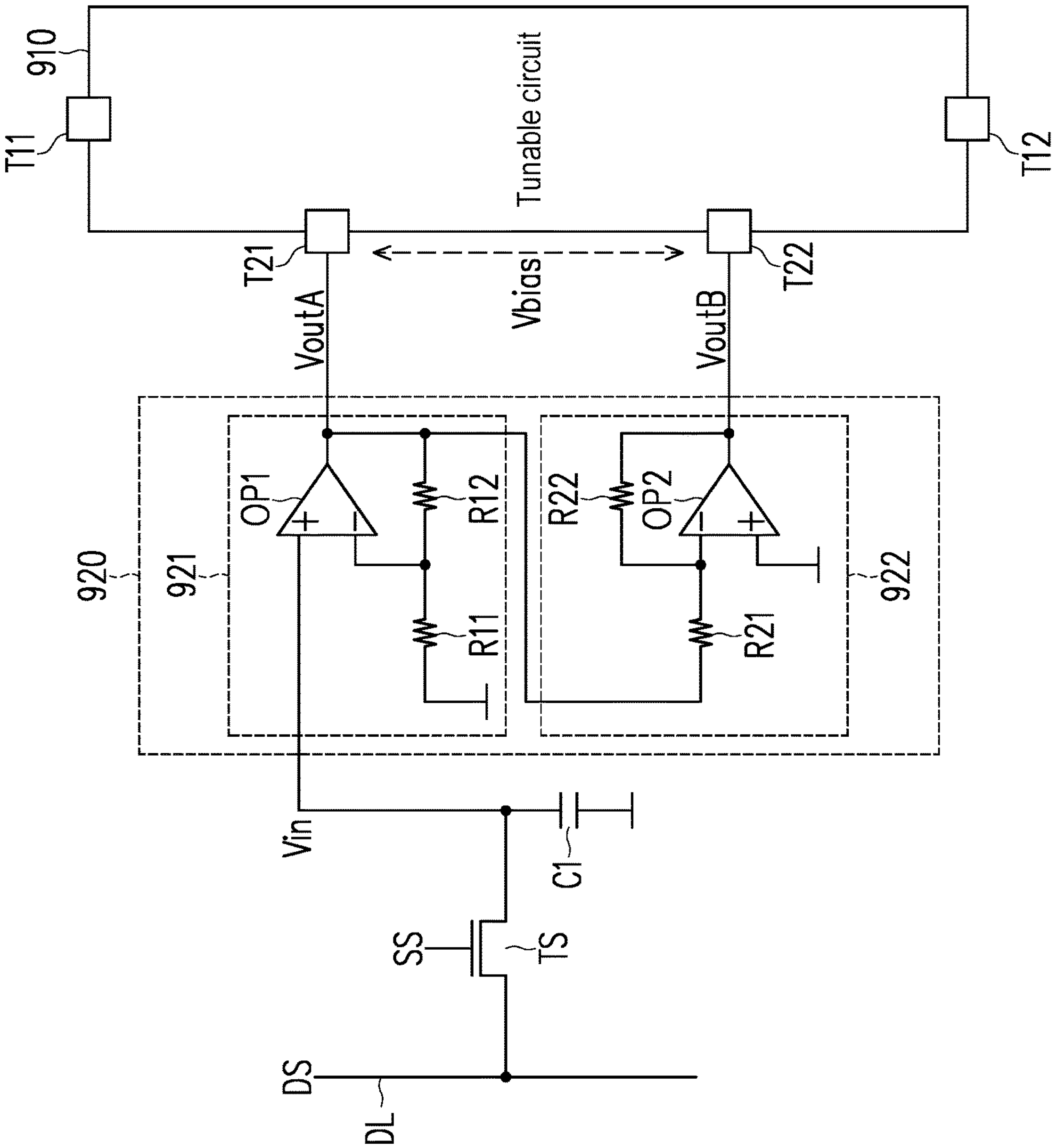
FIG. 9 is a schematic diagram of a driver circuit according to an embodiment of the disclosure.

FIG. 9 is a schematic diagram of a driver circuit according to an embodiment of the disclosure Referring to FIG. 9, a tunable circuit 910 includes a first signal terminal T11, a second signal terminal T12, a first control terminal T21, and a second control terminal T22. The tunable circuit 910 may be implemented as the tunable circuit 210 of FIG. 2. A driver circuit 920 includes a first driver 921, a second driver 922, a scan transistor TS, and a capacitor C1. In the embodiment of the disclosure, the first driver 921 and the second driver 922 may form a cascaded driver circuit. The driver circuit 220 of FIG. 2 may be implemented as the driver circuit 920. In the embodiment of the disclosure, a first terminal of scan transistor TS is coupled to a data line DL, and a second terminal of the scan transistor TS is coupled to the capacitor C1 and the first driver 921. A control terminal of the scan transistor TS is configured to receive a scan signal SS. The data line DL is configured to transmit a data signal DS. The capacitor C1 is coupled between the second terminal of the scan transistor TS and a DC voltage (e.g. a ground voltage).

In the embodiment of the disclosure, the first driver 921 may be a non-inverting amplifier circuit. The first driver 921 includes a first operational amplifier OP1, a first resistor R11 and a second resistor R12, but the disclosure in not limited thereto. In one embodiment of the disclosure, the first driver 921 may include a first source follower amplifier instead of the first operational amplifier OP1. In the embodiment of the disclosure, a non-inverting input terminal of the first operational amplifier OP1 is coupled to the second terminal of the scan transistor TS and the capacitor C1. An inverting input terminal of the first operational amplifier OP1 is coupled to the first resistor R11 and the second resistor R12. The first resistor R11 is coupled between the DC voltage and the inverting input terminal of the first operational amplifier OP1. The second resistor R12 is coupled between the inverting input terminal of the first operational amplifier OP1 and an output terminal of the first operational amplifier OP1. The output terminal of the first operational amplifier OP1 is coupled to the first control terminal T21 of the tunable circuit 910 and the second driver 922.

In the embodiment of the disclosure, the second driver 922 may be an inverting amplifier circuit. The second driver 922 includes a second operational amplifier OP2, a third resistor R21 and a fourth resistor R22, but the disclosure in not limited thereto. In one embodiment of the disclosure, the second driver 922 may include a second source follower amplifier instead of the second operational amplifier OP2. In the embodiment of the disclosure, an inverting input terminal of the second operational amplifier OP2 is coupled to the output terminal of the first operational amplifier OP1 through the third resistor R21, and the inverting input terminal of the second operational amplifier OP2 is further coupled to an output terminal of the second operational amplifier OP2 through the fourth resistor R22. An inverting input terminal of the second operational amplifier OP2 is coupled to the DC voltage. The output terminal of the second operational amplifier OP2 is further coupled to the second control terminal T22 of the tunable circuit 910.

Referring to FIG. 7 to FIG. 9, the timing diagram of the relevant signals of FIG. 7 in FIG. 8 may also be adapted to the embodiment of FIG. 9. In the embodiment of the disclosure, the scan transistor TS receives the data signal DS through the data line DL as shown in FIGS. 7 and 9. During a period from time tl to time t2, the scan signal SS is changed to a high voltage level as shown in FIG. 8, and the scan transistor TS is turned-on, so that the scan transistor TS outputs a data voltage Vin to the capacitor C1 according to the data signal DS. The capacitor C1 may hold the data voltage Vin at the non-inverting input terminal of the first operational amplifier OP1 as shown in FIGS. 7 and 9.

In the embodiment of the disclosure as shown in FIG. 9, a first voltage gain of the first driver 921 may be G1, and the first voltage gain G1 may be determined by the resistances of the first resistor R11 and the second resistor R12. A second voltage gain of the second driver 922 may be G2, and the second voltage gain G2 may be determined by the resistances of the third resistor R21 and the fourth resistor R22. The first operational amplifier OP1 may output a first variable voltage VoutA to the first control terminal T21 of the tunable circuit 910 according to the data voltage Vin and the first voltage gain G1. The first variable voltage VoutA may be equal to the result of multiplying the data voltage Vin and the first voltage gain G1 (i.e. VoutA=Vin×G1). The second operational amplifier OP2 may output a second variable voltage VoutB to the second control terminal T22 of the tunable circuit 910 according to the data voltage Vin, the first voltage gain G1, and the second voltage gain G2. The second variable voltage VoutB may be equal to the result of multiplying the data voltage Vin, the first voltage gain G1, and the second voltage gain G2 (i.e. VoutB=Vin×G1×G2). There is a differential bias voltage Vbias with the first control terminal T21 and the second control terminal T22 (i.e. a voltage difference between the first control terminal T21 and the second control terminal T22), and the differential bias voltage Vbias is equal to the first variable voltage VoutA minus the second variable voltage VoutB (i.e. Vbias=VoutA−VoutB=(Vin×G1)−(Vin×G1×G2)).

For example, if a voltage range of the data voltage Vin is 0 to 5V, the voltage gain G1 is equal to 2, and the voltage gain G2 is equal to −1, a bias voltage range of the differential bias voltage Vbias may be 0 to 20V. That is, the operation range of each of the first driver 921 and the second driver 922 is 10V, but the differential bias voltage Vbias can reach 20V. Moreover, the differential bias voltage Vbias with the first control terminal T21 and the second control terminal T22 is realized with voltage difference between the first control terminal T21 and the second control terminal T22.

Therefore, the driver circuit 920 may effectively drive the tunable circuit 910 by applying the differential bias voltage Vbias with the first control terminal T21 and the second control terminal T22. Moreover, since the first driver 921 and the second driver 922 only need to operate in narrower voltage range to achieve the differential bias voltage Vbias with a wider voltage range without exceeding the voltage tolerance, therefore the driver circuit 920 may have good reliability.

In summary, the electronic device of the disclosure may effectively generate the control signal with the wider voltage range, and effectively drive the tunable circuit by the control signal with the wider voltage range. Moreover, the driver circuit of the electronic device may have good reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:

a tunable circuit, comprising a first control terminal, a second control terminal, a first signal terminal and a second signal terminal, wherein a tunable signal path is between the first signal terminal of the tunable circuit and the second signal terminal of the tunable circuit; and a driver circuit, comprising:

a first driver, coupled to the first control terminal of the tunable circuit; and a second driver, coupled to the second control terminal of the tunable circuit, wherein the tunable signal path is tunable with a differential bias voltage provided by the first control terminal of the tunable circuit and the second control terminal of the tunable circuit.

2. The electronic device according to claim 1, further comprising:

a resonance circuit, coupled to the first signal terminal and the second signal terminal of the tunable circuit.

3. The electronic device according to claim 1, wherein the tunable circuit comprises a tunable component, wherein a first terminal of the tunable component is coupled to the first control terminal of the tunable circuit, and a second terminal of the tunable component is coupled to the second control terminal of the tunable circuit, wherein the tunable component is a variable capacitor, a varactor diode, or a micro electro mechanical system.

4. The electronic device according to claim 3, wherein the first terminal of the tunable component is further coupled to the first signal terminal of the tunable circuit, and the second terminal of the tunable component is further coupled to the second signal terminal of the tunable circuit.

5. The electronic device according to claim 4, wherein the tunable circuit further comprises a first coupling component and a second coupling component, wherein the first terminal of the tunable component is coupled to the first signal terminal of the tunable circuit through the first coupling component, and the second terminal of the tunable component is coupled to the second signal terminal of the tunable circuit through the second coupling component, wherein the first coupling component and the second coupling component comprise a capacitor respectively to provide capacitive coupling.

6. The electronic device according to claim 3, wherein the tunable circuit further comprises a third coupling component and a fourth coupling component, wherein the first terminal of the tunable component is coupled to the first control terminal of the tunable circuit through the third coupling component, and the second terminal of the tunable component is coupled to the second control terminal of the tunable circuit through the fourth coupling component, wherein the third coupling component and the fourth coupling component comprise a resistor respectively to provide resistive coupling.

7. The electronic device according to claim 3, wherein the tunable circuit further comprises a third coupling component and a fourth coupling component, wherein the first terminal of the tunable component is coupled to the first control terminal of the tunable circuit through the third coupling component, and the second terminal of the tunable component is coupled to the second control terminal of the tunable circuit through the fourth coupling component, wherein the third coupling component and the fourth coupling component comprise an inductor respectively to provide inductive coupling.

8. The electronic device according to claim 1, wherein the first driver is configured to output a first variable voltage to the first control terminal of the tunable circuit, and the second driver is configured to output a second variable voltage to the second control terminal of the tunable circuit.

9. The electronic device according to claim 8, wherein the first driver is a first non-inverting amplifier circuit, and the second driver is a second non-inverting amplifier circuit.

10. The electronic device according to claim 8, wherein the first driver is a non-inverting amplifier circuit, and the second driver is an inverting amplifier circuit.

11. The electronic device according to claim 8, wherein the first driver is coupled to a first capacitor, and the second driver is coupled to a second capacitor.

12. The electronic device according to claim 8, wherein the first driver further comprises a first operational amplifier, and the second driver further comprises a second operational amplifier.

13. The electronic device according to claim 8, wherein the first driver and the second driver are coupled to a data line through a scan transistor.

14. The electronic device according to claim 8, wherein the first driver is coupled to a data line through a first scan transistor, and the second driver is coupled to the data line through a second scan transistor.

15. The electronic device according to claim 8, wherein the first driver is coupled to a first data line through a first scan transistor, and the second driver is coupled to a second data line through a second scan transistor.

16. The electronic device according to claim 8, wherein the first variable voltage and the second variable voltage have different output voltage ranges, and wherein the first driver further comprises a first source follower amplifier, and the second driver further comprises a second source follower amplifier.

17. An electronic device, comprising:

a tunable circuit, comprising a first control terminal and a second control terminal; and a driver circuit, comprising:

a first driver, coupled to the first control terminal of the tunable circuit, wherein the first driver is configured to output a first variable voltage to the first control terminal of the tunable circuit; and a second driver, coupled to the second control terminal of the tunable circuit, wherein the second driver is configured to output a second variable voltage to the second control terminal of the tunable circuit, wherein the first variable voltage and the second variable voltage have different output voltage ranges.

18. The electronic device according to claim 17, wherein the first driver is a first non-inverting amplifier circuit, and the second driver is a second non-inverting amplifier circuit.

19. An electronic device, comprising:

a tunable circuit, comprising a first control terminal and a second control terminal; and a driver circuit, comprising:

a first driver, coupled to the first control terminal of the tunable circuit, wherein the first driver is configured to output a first variable voltage and comprises a first source follower amplifier, and a second driver, coupled to the second control terminal of the tunable circuit, wherein the second driver is configured to output a second variable voltage and comprises a second source follower amplifier.

20. The electronic device according to claim 19, wherein the first driver is coupled to a first data line through a first scan transistor, and the second driver is coupled to a second data line through a second scan transistor.

* * * * *